US007493223B2

(12) United States Patent
Kayal et al.

(10) Patent No.: US 7,493,223 B2
(45) Date of Patent: Feb. 17, 2009

(54) PATTERN IDENTIFICATION AND BIT LEVEL MEASUREMENTS ON REPETITIVE PATTERNS

(75) Inventors: Saumitra Kayal, Karnataka (IN); Manisha Ajgaonkar, Karnataka (IN)

(73) Assignee: Tektronix, Inc., Beaverton, OR (US)

( * ) Notice: Subject to any disclaimer, the term of this patent is extended or adjusted under 35 U.S.C. 154(b) by 417 days.

(21) Appl. No.: 11/196,771

(22) Filed: Aug. 2, 2005

(65) Prior Publication Data

US 2007/0032977 A1    Feb. 8, 2007

(51) Int. Cl.
*G01R 13/00*    (2006.01)
*G06F 19/00*    (2006.01)

(52) U.S. Cl. .............................. 702/66; 702/67; 702/73; 702/79; 375/224; 375/225

(58) Field of Classification Search ............. 702/66–80, 702/124, 176–180; 375/214, 224–228
See application file for complete search history.

(56) References Cited

U.S. PATENT DOCUMENTS 5,295,155 A * 3/1994 Gersbach et al. ............ 375/214
2004/0078158 A1 * 4/2004 MacDonald ................. 702/66

OTHER PUBLICATIONS

Sacchi et al., Transmission Capabilities of a Novel Multi-Wavelength Erbium-Ytterbium Glass Laser Source, vol. 6, No. 2, Feb. 1994.*

* cited by examiner

*Primary Examiner*—Eliseo Ramos Feliciano
*Assistant Examiner*—Phuong Huynh
(74) *Attorney, Agent, or Firm*—Francis I. Gray; Thomas F. Lenihan

(57) ABSTRACT

A method of pattern identification and bit level measurements for a high speed digital signal using an oscilloscope converts an input waveform into a bit stream sequence. From the bit stream sequence pre-defined patterns are identified and overlaid on each other to form a superimposed pattern. A center region for each bit of the superimposed pattern is identified, and appropriate voltage measurements within the respective center regions are taken for the bit levels.

6 Claims, 4 Drawing Sheets

MATCHED
PATTERN EDGES

REPRESENTATIVE
PATTERN MATRIX

VOLTAGE,TIME -> x,y,z

HIT MATRIX

RECOVERED
CLOCK EDGES

STEP 1: ACQUIRE WAVEFORM DATA

STEP 2: CALCULATE ZERO CROSSINGS
RECOVER CLOCK

STEP 3: CALCULATE BIT RATE

STEP 4: GENERATE BIT STREAM

STEP 5: IDENTIFY BIT PATTERNS

STEP 6: CREATE HIT MATRIX

STEP 7: IDENTIFY BIT CENTER REGIONS

STEP 8: CREATE HORIZONTAL HISTOGRAM

STEP 9: CALCULATE BIT VOLTAGE LEVELS

PATTERN IDENTIFICATION AND BIT LEVEL MEASUREMENTS ON REPETITIVE PATTERNS

BACKGROUND OF THE INVENTION

The present invention relates to testing signal integrity, and more particularly to pattern identification and bit level measurements on repetitive patterns.

For testing signal integrity of certain high speed serial digital signals, such as Serial ATA-II signals defined by an electrical specification (Version 1.0 dated May 19, 2004), differential voltage measurements are specified. The measurements need to be on a signal that has a pre-defined repetitive pattern. The specification generally specifies a methodology that implies the use of a high bandwidth oscilloscope in a waveform database (wfmDB) mode to perform this measurement. The wfmDB mode is the acquisition process of sampling an analog input signal after a trigger event, digitizing each sample of the analog input signal to convert it to digital data, assembling the digital data into a waveform memory, and displaying a waveform that is the accumulation of several acquisitions. The waveform displays not only time and amplitude, but also a count of the number of times a specific sample has been acquired over multiple acquisitions. The value at each point (time after trigger event and amplitude) on the waveform is a counter that reflects such hit intensity. However this specified methodology has some limitations, as indicated below.

A pattern trigger is needed to accumulate samples in the wfmDB mode so that the acquired signal has the same pattern. However with the pattern trigger decoding, start and stop of the incoming data is not possible so there is a chance of false triggering, which leads to an incorrect "eye" pattern as shown in FIG. 1.

Further the trigger bandwidth of the oscilloscope is limited, for example to 1.25 Gbps, and therefore cannot be used for high bandwidth signals, such as the Serial ATA signal having a bandwidth of 1.5 Gbps and 3 Gbps.

Finally the wfmDB mode is limited to a defined data matrix resolution, such as 500×200. For a 3 Gbps signal a unit interval (one clock cycle) is 333.333 ps so the acquisition for a 20-bit pattern is approximately 7 ns. The horizontal resolution of the data matrix is approximately 14 ps. The specification, such as the Serial ATA specification, specifies a region of each bit within which the measurement should be taken, i.e., between 45% and 55% of each bit—the middle of the bit. Thus the number of pixels available in the period 33.3 ps (45% and 55% of a bit) is two, which is not good enough to ascertain the correct voltage level.

What is desired is a better technique for performing pattern identification and bit level measurements on a signal containing repetitive patterns arriving at sporadic time intervals.

BRIEF SUMMARY OF THE INVENTION

Accordingly the present invention provides a technique for performing pattern identification and bit level measurements on a signal containing repetitive patterns arriving at sporadic time intervals. An acquired waveform signal is converted into a string of characters representing a bit stream for the acquired waveform. The character string is compared to a pre-defined pattern string to identify corresponding patterns in the character string and to identify a time stamp for each identified pattern. The respective identified patterns are overlaid in a hit matrix to generate a superimposition of all of the identified patterns. The columns of the hit matrix corresponding to the center regions of each bit of the identified pattern are used to generate a histogram for each bit from which the appropriate measurements are made.

The objects, advantages and other novel features of the present invention are apparent from the following detailed description when read in conjunction with the appended claims and attached drawing.

DETAILED DESCRIPTION OF THE INVENTION

The technique described herein enables a user to identify a pre-defined pattern of data within an acquired stream of data. The identified portions of the data pattern are superimposed, one over the other, using a clock recovery and slicing mechanism that prevents erroneous "eye" pattern formations and eliminates the need for pattern triggering at a high bandwidth, i.e., is free from false triggering. The population of the superimposed pattern is substantial enough, and the measurement is based on a sample point resolution, such as up to 4 ps. The core mechanism for this measurement is identifying the pre-defined pattern within the acquired data stream.

The technique is divided into the following steps:
1. Convert the acquired waveform into 1s and 0s, i.e., a bit stream.
2. Identify the pre-defined pattern and time stamp from the bit stream.
3. Overlay or superimpose the identified patterns from the bit stream.
4. Identify a central region (45%-55%) for each bit on the superimposed pattern.
5. Perform a voltage level measurement on the bits within the bit stream.

Figure 1:
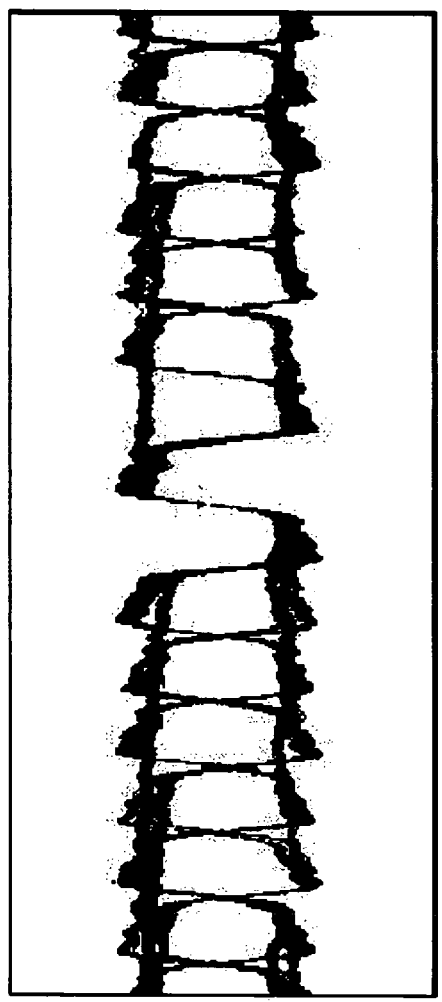
FIG. 1 is a graphic view of an illegal "eye" diagram according to the prior art.
Figure 2:
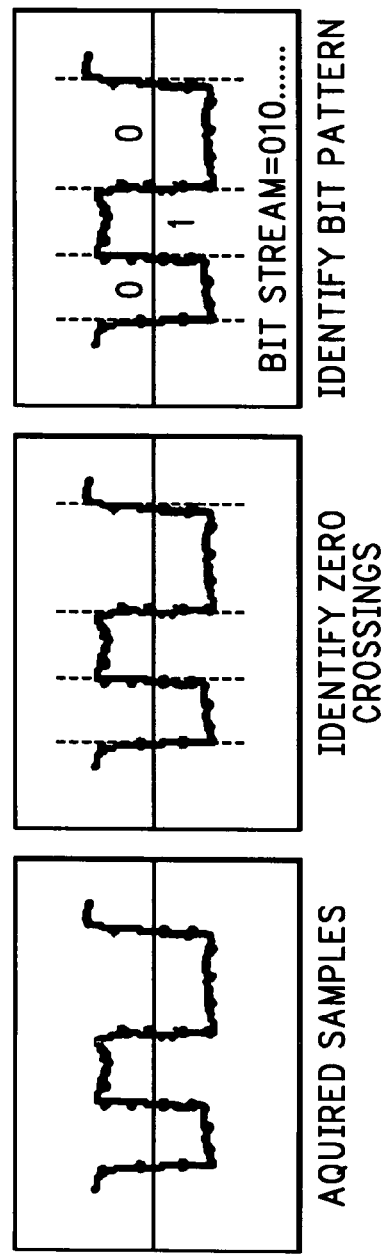
FIG. 2 is a representative view for converting a waveform signal into a character string according to the present invention.

Referring now to FIG. 2, which illustrates how to convert the acquired waveform into 1s and 0s zero crossing points are found from the acquired signal and a clock is recovered, also from the acquired signal, using a constant clock recovery mechanism. The zero crossing points represent the edges of the signal that are identified for both rising and falling slopes on a voltage differential waveform at a fifty percent (50%) level using a waveform analysis module. The edge information is stored in two arrays: one representing the edge indices and the other representing a corresponding time value relative to the trigger event. The constant clock recovery is done using a least square fit algorithm applied to the transition time intervals with a pre-defined data rate. From the recovered clock data identify a unit interval (one bit time) value. For non-return-to-zero data (NRZ) calculate the number of bits between two zero crossings using the unit interval value and zero crossing points.

$$\text{Number\_of\_bits} = \text{crossing\_time\_difference} / \text{unit\_interval}$$

The signal should have a minimum amplitude to detect the 1s and 0s. Two threshold voltages may be defined such that, if the signal goes above the maximum threshold, it is a "1" state and, if the signal goes below the minimum threshold, it is a "0" state. Two thresholds are generally used to prevent false state determinations due to noise or other erroneous low-level variations in the signal.

Go to the mid-position between each pair of consecutive zero crossing points and see whether the voltage level is above the maximum threshold or below the minimum threshold. If it is above the maximum threshold, identify this as a "1" state and using the above equation find the number of bits in this region. Now fill an array of characters with that number of 1s, otherwise with that number of 0s if the voltage level is below the minimum threshold. Complete the above process for all zero crossing point pairs of the input waveform. The result is an array of "0" and "1" characters, i.e., the bit stream of data.

Figure 3:
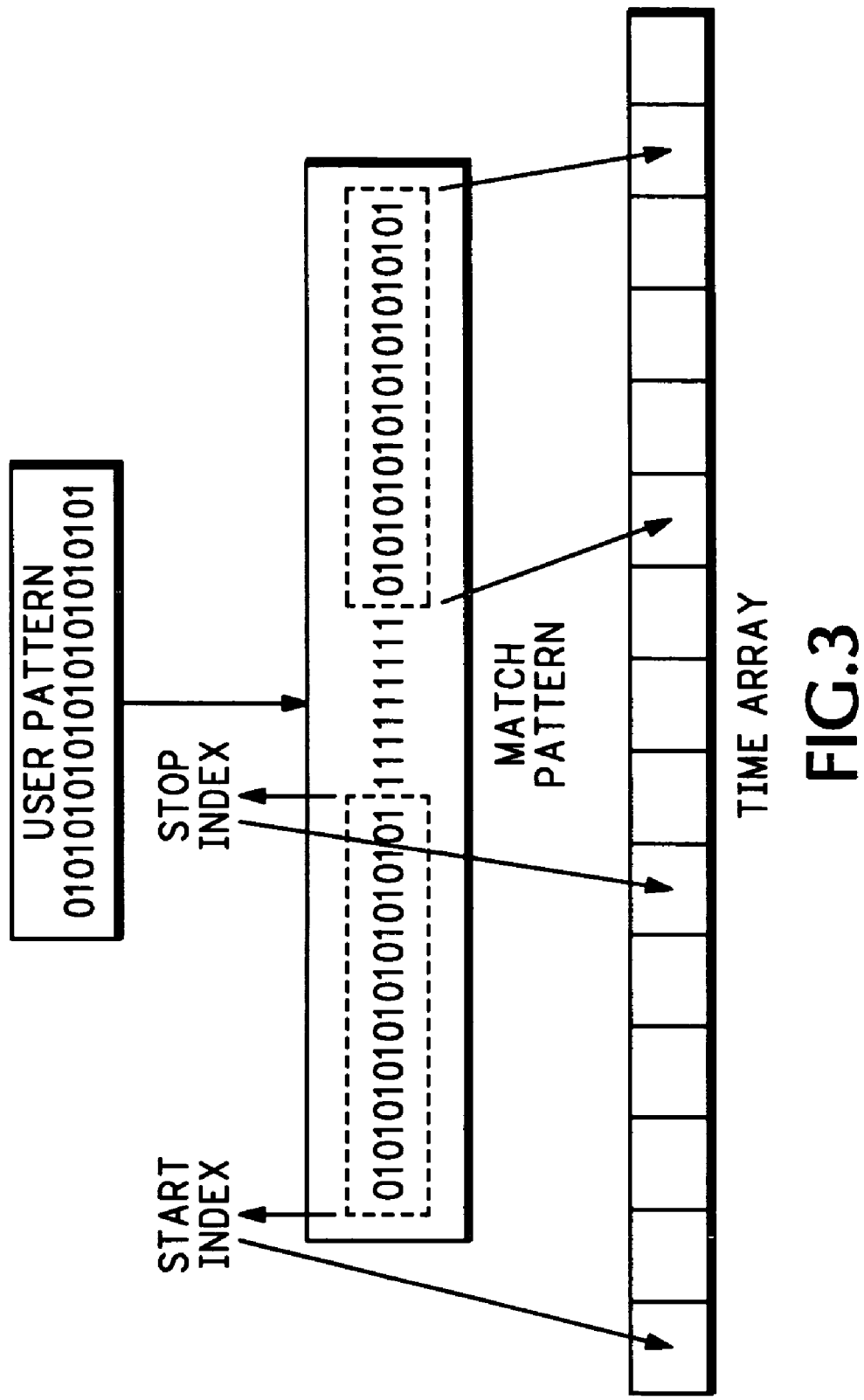
FIG. 3 is a representative view for pattern matching according to the present invention.

To identify the pattern and time stamp from the bit stream a pattern verification algorithm finds a position of a pre-defined pattern according to the communication standard from the bit stream. The bit stream is converted into a stream string, i.e., transfer the bit stream into a character string. The pre-defined pattern is converted into a pattern string. Find all the patterns in the stream string corresponding to the pattern string, and the identified pattern positions within the stream string represent the time stamp for the identified pattern. Referring now to FIG. 3 the pre-defined pattern is shown having a string of 20 bits alternating between 1s and 0s. An acquired bit stream is shown that has the same pattern replicated corresponding to a time array. The pattern verification algorithm identifies patterns in the character string corresponding to the pre-defined pattern and their locations in the bit stream.

Figure 4:
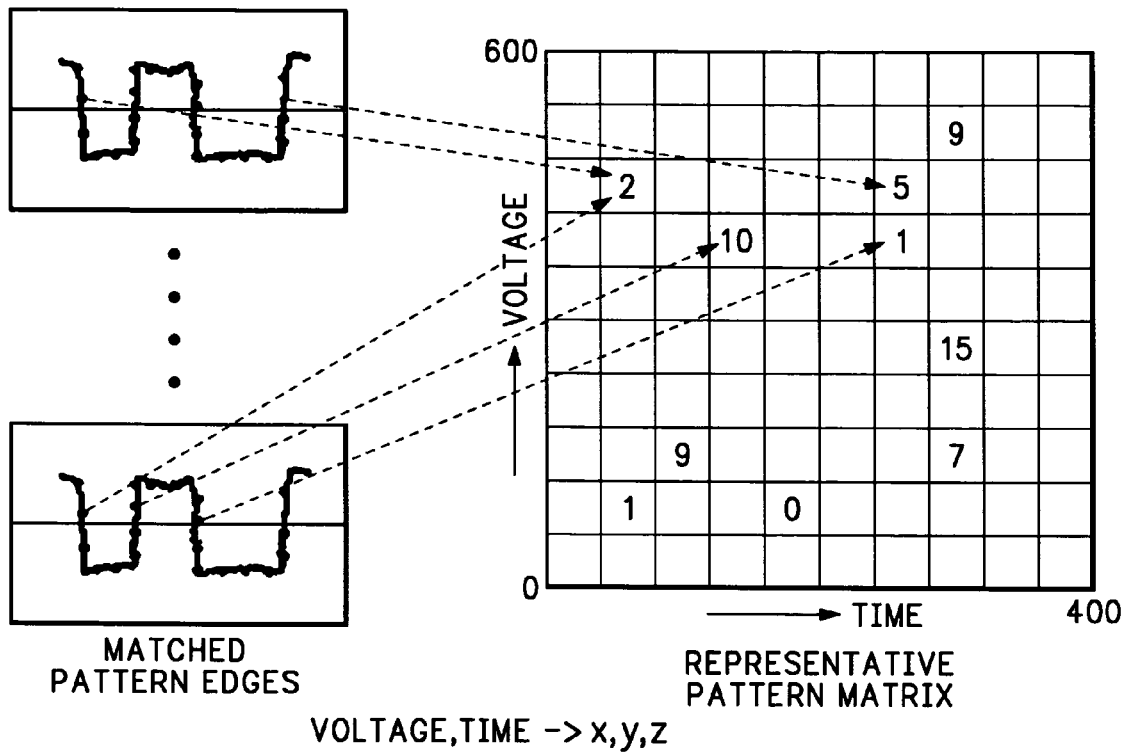
FIG. 4 is a representative view illustrating overlaying of multiple identified patterns in a matrix according to the present invention.
Figure 5:
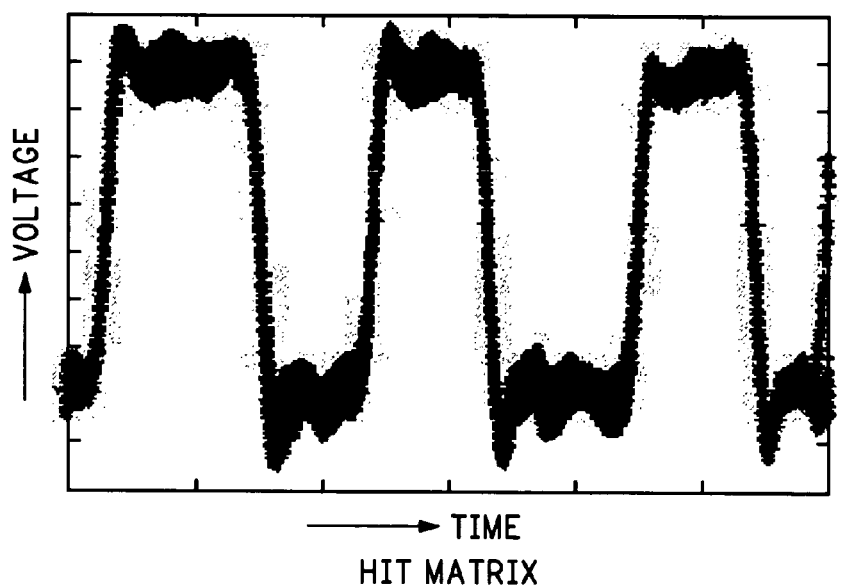
FIG. 5 is a graphic view of an overlaid or superimposed pattern matrix according to the present invention.

Overlay or superimpose each of the identified patterns having a fixed length in a matrix, as illustrated in FIG. 4. The dimension of the matrix may be configured by a user, and may be scaled up and down according to the signal speed so that there is a sufficient number of hits counted within each bit. For each pre-defined pattern identified in the bit stream take all the waveform data points from the start recovery point (start index) to the end clock recovery point (stop index). Map the pattern (scaled up or down as necessary) into an assigned matrix. Each cell in the matrix is a counter that reflects the number of hits for that cell. The cumulative population provides superimposition for the various occurrences of the pattern in the acquired waveform signal, i.e., identify the position of each data point on the matrix and add one to the hit count for the corresponding cell of the matrix. This may be enhanced by interpolating the acquired sample, i.e., applying a Sinc interpolation function to the acquired sample. A complete overlaid or superimposed pattern matrix is shown in FIG. 5. In the matrix each of the sampled values for the pattern is represented as a three-dimensional vector: X—time scaled within a defined range, such as 0-400; Y—scaled within a defined range, such as 0-600; and Z—population for a given X, Y cell or point in the matrix.

Figures 6, 7:
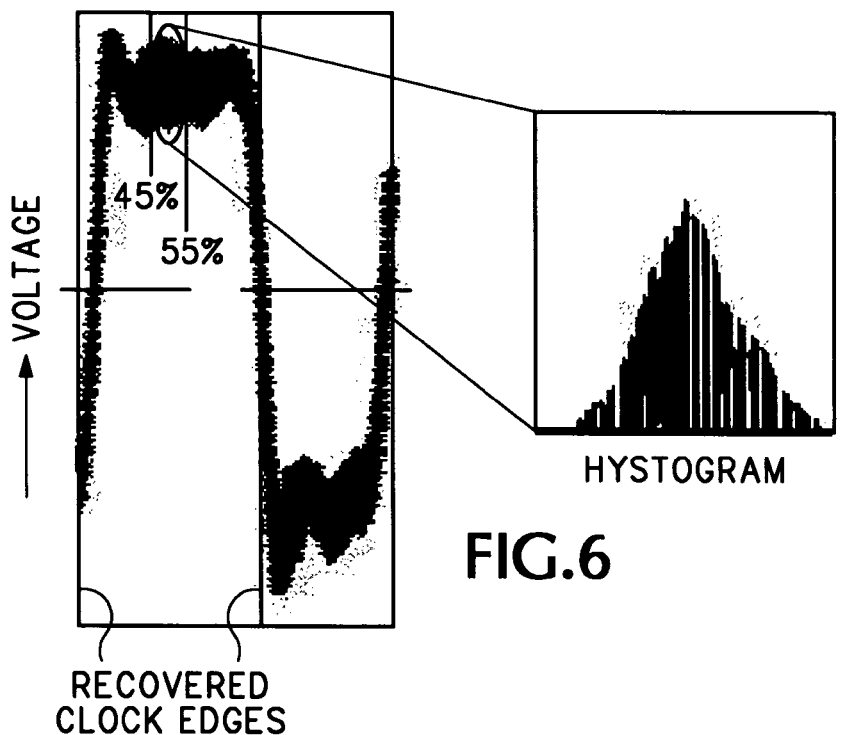
FIG. 6 is a representative view illustrating generating a histogram for measurements according to the present invention.
FIG. 7 is a flow diagram view of the process for pattern identification and bit level measurement according to the present invention.

In the matrix generation process the start of the recovered clock is the first column of the matrix. The end of each pattern is the last column of the matrix. The start and end of all bits in the matrix are identified by correcting the calculated edge times using the recovered clock. Then the columns belonging to the central (45%-55%) region of each bit are identified. A histogram of this region is created, as shown in FIG. 6. The histogram represents amplitude values, with the range of amplitude values depending upon the measurement being made. From the created histogram check a condition as prescribed in the pertinent specification, such as the Serial ATA-II document, and calculate all the required parameters for the pre-defined pattern, such as for HFTP, MFTP, LFTP and LBP patterns. The amplitude values depend on the pattern and desired measurement.

FIG. 7 is a data flow chart of the process described above. Waveform data is input and acquired in step 1. For the acquired waveform data calculate the zero crossings and recover the clock using the constant clock recovery method (step 2). Calculate a bit rate for the input signal (step 3). Identify the number of bits between each consecutive pair of zero crossing points and generate the bit stream sequence of 1s and 0s (step 4). Identify the start positions of each instance of the pre-defined pattern within the bit stream sequence so that there is no overlap between consecutive patterns (step 5). Create a hit matrix using all identified patterns (step 6). Identify a center region for each bit from the hit matrix (step 7). Create a horizontal histogram for each center region (step 8). Calculate the required voltage levels as specified in the pertinent signal specification (step 9).

The above technique automates a testing procedure and is extensible to new patterns that evolve in future versions of a signal specification.

Thus the above described technique identifies bit patterns in a high speed serial digital signal by converting the high speed serial digital signal to a bit stream, identifying a pre-defined pattern and time stamp within the bit stream, overlaying or superimposing consecutive patterns identified within the bit stream in a matrix, identifying a central region for each bit in the matrix, and performing pertinent voltage measurements within the central region of each bit to obtain bit levels.

What is claimed is:

1. A method of pattern identification comprising the steps of:
  acquiring an input waveform signal and storing a representation of said acquired input waveform signal;
  converting said acquired input waveform signal into a bit stream sequence of characters representative of binary bits;
  identifying from the bit stream sequence a pre-defined pattern of said characters representative of binary bit values;
  overlaying portions of said acquired waveform signal, which portions correspond to said pre-defined patterns of characters identified from the bit stream to form a superimposed pattern; and
  identifying a central region for each bit of the superimposed pattern for performing measurements.

2. The method as recited in claim 1, further comprising: a step of performing voltage measurements within the central region of each bit.

3. The method as recited in claim 1 wherein the converting step comprises the steps of:
  finding zero points from the input waveform signal;
  recovering a clock using a constant clock recovery mechanism;
  identifying from the clock a unit interval value;

calculating a number of bits between consecutive zero crossings using the unit interval value;

determining a state of the input waveform at a mid-point between zero crossings; and providing the bit stream sequence from the succession of states of the input waveform.

4. The method as recited in claim 1 wherein the pre-defined pattern identifying step comprises the steps of:

converting the bit stream sequence into a character string;

converting the pre-defined pattern into a pattern string;

finding a plurality of the pattern strings within the character string, the relative positions representing a time stamp for each found pattern string; and storing the found pattern strings from the bit stream sequence.

5. The method as recited in claim 1 wherein the overlaying step comprises the steps of:

identifying a start clock recovery point for each stored found pattern string; and mapping the pre-defined pattern for each pattern string into a hit matrix to produce the superimposed pattern.

6. The method as recited in claim 1 wherein the center region identifying step comprises the steps of:

identifying a start and end for each bit in the superimposed pattern;

identifying columns of data in the hit matrix belonging to the center region for each bit; and creating a histogram for each bit from the data within the respective center regions.

\* \* \* \* \*